United States Patent
Staats et al.

(10) Patent No.: US 9,754,776 B2
(45) Date of Patent: Sep. 5, 2017

(54) LUMINESCENT CONVERTER FOR A PHOSPHOR-ENHANCED LIGHT SOURCE

(75) Inventors: Cornelia Titia Staats, Eindhoven (NL); Gerardus Arnoldus Rita Van Dijk, Eindhoven (NL); Rene Theodorus Wegh, Eindhoven (NL); Willibrordus Hubertus Martinus Maria Van De Spijker, Eindhoven (NL); Martinus Petrus Joseph Peeters, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 1452 days.

(21) Appl. No.: 13/262,873

(22) PCT Filed: Mar. 31, 2010

(86) PCT No.: PCT/IB2010/051405
§ 371 (c)(1),
(2), (4) Date: Jan. 17, 2012

(87) PCT Pub. No.: WO2010/116294
PCT Pub. Date: Oct. 14, 2010

(65) Prior Publication Data
US 2012/0119639 A1  May 17, 2012

(30) Foreign Application Priority Data
Apr. 6, 2009  (EP) ..................................... 09157430

(51) Int. Cl.
*H01J 61/48* (2006.01)
*H01J 61/38* (2006.01)
(Continued)

(52) U.S. Cl.
CPC .............. *H01J 61/44* (2013.01); *C09K 11/06* (2013.01); *C09K 11/7774* (2013.01); *H01J 61/48* (2013.01); *H01L 33/504* (2013.01)

(58) Field of Classification Search
CPC ........ H01L 33/504; H01J 61/38–61/48; C09K 11/06
(Continued)

(56) References Cited

U.S. PATENT DOCUMENTS 4,001,628 A * 1/1977 Ryan ...................... C09K 11/06
                                                        313/111
7,078,732 B1    7/2006 Reeh et al.
(Continued)

FOREIGN PATENT DOCUMENTS

CN    1880403 A    12/2006
EP    0481647 A2    4/1992
(Continued)

OTHER PUBLICATIONS

Hybrid.pdf—See highlighted text. "Emission characteristics of inorganic/organic hybrid white-light phosphor", Appl. Phys. A 2005, v 80, p. 337-339. Free document from web at http://www.springerlink.com/content/qx7cr0ncffxtkl37/fulltext.pdf?page=1.

*Primary Examiner* — Mariceli Santiago

(57) ABSTRACT

The invention relates to a luminescent converter (10, 12) for a phosphor-enhanced light source (100, 102, 104). The luminescent converter comprises a first luminescent material (20) configured for absorbing at least a part of excitation light (hv0) emitted by a light emitter (40, 42) of the phosphor-enhanced light source, and for converting at least a part of the absorbed excitation light into first emission light (hv1) comprising a longer wavelength compared to the excitation light. The luminescent converter further comprising a second luminescent material (30) comprising organic luminescent material (30) and configured for absorbing at (Continued)

least a part of the first emission light emitted by the first luminescent material, and for converting at least a part of the absorbed first emission light into second emission light (hv2) having a longer wavelength compared to the first emission light.

An effect of the luminescent converter according to the invention is that the two-step light conversion according to the invention generates a relatively small Stokes shift of the light emitted by the organic luminescent material. The inventors have found that by reducing the Stokes shift of the organic luminescent material, the width of the spectrum of the second emission light is limited to reduce an infrared part in the emission spectrum. As such, the efficiency is improved.

16 Claims, 5 Drawing Sheets

(51) Int. Cl.
*H01J 61/44* (2006.01)
*C09K 11/06* (2006.01)
*C09K 11/77* (2006.01)
*H01L 33/50* (2010.01)

(58) Field of Classification Search
USPC .......... 313/485–487, 500–512; 257/98–100
See application file for complete search history.

(56) References Cited

U.S. PATENT DOCUMENTS

| | | | |
|---|---|---|---|
| 7,696,685 B2* | 4/2010 | Yamakawa | 313/503 |
| 2003/0030060 A1* | 2/2003 | Okazaki | H01L 33/504 257/79 |
| 2006/0065907 A1 | 3/2006 | Lee et al. | |
| 2006/0138938 A1* | 6/2006 | Tan | C09K 11/06 313/503 |
| 2006/0208270 A1* | 9/2006 | Chandran et al. | 257/100 |
| 2006/0214578 A1 | 9/2006 | Iwanaga et al. | |
| 2006/0220531 A1 | 10/2006 | Tokunaga et al. | |
| 2007/0228932 A1* | 10/2007 | Amano et al. | 313/502 |
| 2010/0289404 A1* | 11/2010 | Tamaki et al. | 313/503 |

FOREIGN PATENT DOCUMENTS

| | | |
|---|---|---|
| JP | 2003051622 A | 2/2003 |
| JP | 2006206841 A | 8/2006 |
| JP | 2007250629 A | 9/2007 |
| JP | 2008174621 A | 7/2008 |

\* cited by examiner

LUMINESCENT CONVERTER FOR A PHOSPHOR-ENHANCED LIGHT SOURCE

FIELD OF THE INVENTION

The invention relates to a luminescent converter for a phosphor-enhanced light source.

The invention further relates to the phosphor-enhanced light source comprising a light emitter and the luminescent converter.

BACKGROUND OF THE INVENTION

Phosphor-enhanced light sources are known per se and are used for substantially all kinds of light sources. Phosphor-enhanced light sources comprise a light emitter and a luminescent material. The luminescent material is arranged for converting at least part of the light emitted by the light emitter into light of a longer wavelength.

Well-known phosphor-enhanced light sources are, for example, mercury vapor discharge lamps in which the light is emitted from a discharge in which the presence of mercury vapor causes the discharge to emit ultraviolet radiation. At least a part of the ultraviolet radiation is absorbed by a luminescent material and converted into light of a longer wavelength which is subsequently emitted by the luminescent material. Such mercury vapor discharge lamp may, for example, comprise a discharge vessel in which the discharge is generated. The luminescent material is typically applied to the inner wall of the discharge vessel such that the ultraviolet radiation emitted by the discharge does not need to pass the discharge vessel but is inside the discharge vessel converted into, for example, visible light.

Alternatively, the phosphor-enhanced light source may comprise a solid-state light emitted as the light emitter. Such a solid-state light emitter may, for example, be a light emitting diode, or a laser diode, or an organic light emitting diode. The light emitted by a solid-state light emitter typically has a relatively narrow spectrum arranged around a center wavelength. The width of the spectrum may, for example, be defined by the Full Width Half Maximum (further also indicated as FWHM) of the emission peak which is a width of the emission peak measured at an intensity being half the maximum emission intensity of the light emitted by the solid-state light emitter. The FWHM of a typical emission spectrum of the solid-state light emitter is less than 30 nanometer, which is typically identified by the human eye as light of a single color. To change the color of the light emitted by the solid-state light emitter, luminescent materials may be added to generate a phosphor-enhanced light source. The luminescent material may, for example, be applied as a layer on top of the die of the solid-state light emitter, or may, for example, be dispersed in a matrix which may be located at a distance of the solid-state light emitter, a so called "remote phosphor" arrangement. The luminescent material may also be part of a mixture of different luminescent materials, for example, each generating a different color such that the mixed light, for example, generates white light having a specific color temperature. Furthermore, luminescent materials may be added to solid-state light emitters to improve the color rendering characteristics of the solid-state light emitters, as the typical emission characteristic of the luminescent materials is a relatively broad spectrum of light.

Recently new luminescent materials are being used in phosphor-enhanced light sources, such as organic luminescent materials, especially to replace known in-organic luminescent materials which are used to provide the "Red"-contribution in white light sources. Known in-organic luminescent materials which provide the "Red"-contribution have relatively poor efficiency due to their broad FWHM and therewith emission in the deep (Infra)-red. To still ensure sufficient "Red"-contribution to generate white light having the required color temperature, a relatively large amount of "Red"-contributing luminescent material is required. As such, the relatively large amount of "Red"-contributing luminescent material required results in increased costs and requires relatively high light emission intensity from the light emitter of the phosphor-enhance light source. As such, more efficient luminescent materials are required, especially to provide the "Red"-contribution to the light emitted by the phosphor-enhanced light source. As such, organic luminescent materials are introduced in phosphor-enhanced light sources which may be mixed with known luminescent materials to obtain a more efficient light converter.

Such a phosphor enhanced light source comprising organic luminescent materials in the luminescent mixture are, for example, known from the US patent application US 2006/0214578 and from the US patent application US 2006/0220531. Both cited US patent applications disclose a semiconductor light emitting apparatus which includes a packaging member, a light-emitting element mounted in the packaging member and a wavelength changer. The wavelength changer absorbs the light from the light-emitting element and emits a wavelength-converted light. The wavelength changer includes inorganic fluorescent material and organic fluorescent material.

Still, the efficiency of the light conversion of the mixture of luminescent materials as disclosed in the cited patent applications should be further improved.

SUMMARY OF THE INVENTION

It is an object of the invention to provide a luminescent converter having improved efficiency.

According to a first aspect of the invention the object is achieved with a luminescent converter for a phosphor-enhanced light source, the luminescent converter comprising:

a first luminescent material configured for absorbing at least a part of excitation light emitted by a light emitter of the phosphor-enhanced light source, and for converting at least a part of the absorbed excitation light into first emission light comprising a longer wavelength compared to the excitation light, the luminescent converter further comprising a second luminescent material comprising organic luminescent material and configured for absorbing at least a part of the first emission light emitted by the first luminescent material, and for converting at least a part of the absorbed first emission light into second emission light having a longer wavelength compared to the first emission light.

An effect of the luminescent converter according to the invention is that the two-step light conversion according to the invention enables the use of a (red-emitting) organic luminescent material with a relatively small Stokes shift. Not wishing to be held to particular theory, the inventors have found that this relatively small Stokes shift results in an emission spectrum emitted by the organic luminescent material which remains relatively narrow. Typically the second emission light has relatively long wavelength and typically represents the "Red"-contribution to light emitted by the phosphor enhanced light source. This "Red"-contribution should preferably have an emission spectrum having a specific width rather than a substantial line emission to ensure good color rendering characteristics of the phosphor-enhanced light source. However, the FWHM of the emission spectrum of the "Red"-contribution should be limited in order not to comprise too much infrared light as this only results in emission of non-usable infrared light which again reduces the efficiency of the phosphor enhanced light source. The inventors have found that by reducing the Stokes shift of the organic luminescent material, the width of the spectrum of the second emission light is limited such that a sufficient "Red"-contribution may be obtained to have good color rendering while substantially no light is emitted in the infrared part of the spectrum. As such, the efficiency is improved.

Generally a two-step light conversion is not preferred because of efficiency considerations. Losses due to the conversion of the light by the luminescent material is a combination of the Stokes losses from each conversion and the losses due to the quantum efficiency of the luminescent material used for each conversion. Generation of long-wavelength light by two-step light conversion seems less efficient than in one step because the efficiency is decreased by the product of the quantum efficiencies of each of the individual luminescent materials. However, recently developed organic luminescent materials have a relatively efficient absorption peak at or near the part of the light spectrum perceived as Green. Furthermore, said recently developed organic luminescent materials emit light in the part of the light spectrum perceived as Red light while having a quantum efficiency of 90% or more. This means that 90% or more of the green photons absorbed by this organic luminescent material is converted into photons of a longer wavelength. This combination of relatively small Stokes shift and high absorption and quantum efficiency enables these organic luminescent materials to be efficiently used in such a two step light conversion system while still improving the overall efficiency of the phosphor-enhanced light source.

The known phosphor-enhanced light sources which use organic luminescent materials comprise organic luminescent materials which are configured to be excited with the light emitted by the light-emitting element, typically a blue or UV light emitting diode. This implies typically a relatively large Stokes shift for the organic luminescent material and as such a relatively broad emission spectrum emitted by the known organic luminescent materials, thus comprising a considerable amount of infrared light. Furthermore, the light conversions which require a relatively large Stokes shift also often have relatively low quantum efficiency and as such the overall conversion efficiency of the known organic luminescent material is still relatively poor. This is especially true for luminescent materials emitting light of the color red. In the luminescent converter according to the invention a relatively small Stokes shift is used which results in a relatively narrow emission spectrum enabling a designer to choose the organic luminescent material which provides sufficient "Red"-contribution to generate a good color rendering while preventing the emission of infrared light and while having a relatively high quantum efficiency. As such, although the luminescent converter according to the invention comprises a two-step light conversion, the overall efficiency of the luminescent converter is improved.

A further benefit of the use of organic luminescent materials having a high quantum efficiency is that the amount of luminescent material to provide sufficient "Red"-contribution to generate the required color temperature of the light emitted by the phosphor enhanced light source is relatively low. As luminescent materials are relatively expensive, the use of such luminescent materials having a relatively high absorption and quantum efficiency allows a further cost reduction as less luminescent material is required. Although the cost reduction per phosphor enhanced light source may not be much in absolute numbers, due to the typically high numbers of phosphor-enhanced light sources produced, these cost reductions are commercially very relevant.

The light emitter may be any light source emitting excitation light having a predefined spectrum, for example, a low pressure discharge lamp, a high pressure discharge lamp, an incandescent lamp, a solid-state light emitter, or even a further luminescent material emitting the excitation light.

In this context, light of a specific color, for example, the color red or green, typically comprises light having a predefined spectrum. The predefined spectrum of the specific color may comprise light contributions having a specific bandwidth around a central wavelength which is perceived as light of the specific color. The predefined spectrum may also be constituted of a plurality of narrow spectra in which the central wavelength may be defined as the wavelength of the perceived color of the plurality of narrow spectra. The central wavelength is a mean wavelength of a radiant power spectral distribution. In this context, light of a predefined color also includes non-visible light, such as ultraviolet light and infrared light. The term "primary color" is typically used for light which is used to be mixed such that substantially every color can be generated. The primary colors, for example, include Red, Green, Blue, Yellow, Amber, and Magenta. Light of the specific color may also comprise mixtures of primary colors, such as Blue and Amber, or Blue, Yellow and Red, or Blue, Green and Red. The specific color may, for example, be constituted of a specific combination of the Red, Green and Blue light. Light of a specific color also includes White light and includes different types of White light which is typically indicated as White light having a specific color temperature. The number of primary colors used to generate the specific color may vary.

In an embodiment of the luminescent converter, a wavelength difference between the first emission light and the second emission light is less than 150 nanometers and/or wherein a wavelength difference between the first emission light and the second emission light is less than 100 nanometers. The inventors have found that when using an organic luminescent material which converts light while having a Stokes-shift below 150 nanometers or, more preferably, below 100 nanometers, the emission spectrum remains narrow which enables to limit the infrared contribution of the organic luminescent material and as such ensure good efficiency. In such a luminescent converter the first luminescent material may, for example, convert the excitation light into Blue light and the second luminescent material may, for example, convert part of the Blue light into Yellow light. Choosing a specific combination of the Blue light and the Yellow light results in substantially White light which is emitted from the phosphor enhanced light source. Alternatively, the light emitter may emit excitation light which may, preferable, be Blue light. Only part of the excitation light is absorbed by the first luminescent material and converted into Green light. The remainder of the Blue light is directly emitted by the phosphor enhanced light source without conversion and contributes to the color emitted from the phosphor enhanced light source. Subsequently part of the Green light emitted by the first luminescent material is absorbed by the second luminescent material and converted into Red light. The remainder of the Green light is emitted by the phosphor enhanced light source without further conversion and contributes together with the Blue light and the Red light to the color of the light emitted by the phosphor enhanced light source. Choosing a specific amount of first luminescent material and second luminescent material, respectively, determines the individual contributions of the excitation light, first emission light and second emission light, and as such the color of the light emitted by the phosphor enhanced light source.

In an embodiment of the luminescent converter, the first luminescent material comprises an inorganic luminescent material. A benefit of this embodiment is that a broad range of inorganic luminescent materials are already known and used in many different applications. Often these inorganic luminescent materials may relatively easily withstand the harsh environments inside a discharge vessel or near a light emitting diode and as such may be used to shield the organic luminescent materials from the high intensity and high density light flux emitted by the light emitter.

In an embodiment of the luminescent converter, the first luminescent material and the second luminescent material constitute layers of luminescent material in a stack of luminescent materials. The first luminescent material and second luminescent material may, for example, not mix or may not mix in a similar solvent. As such, the layered structure provides the benefit that the different luminescent materials may be generated via a production process which is best suited for the specific luminescent material. For example, organic luminescent materials are often soluble to generate a liquid having a specific viscosity. Such a liquid may, for example, be easily applied on a carrier material in a substantially uniform layer via well known spin-coat techniques. The first luminescent material may not be soluble and as such the layer of first luminescent material may be generated via other techniques suitable for the chosen first luminescent material.

In an embodiment of the luminescent converter, a protective layer is applied on the second luminescent material for protecting the second luminescent material. Such a protective layer may, for example, protect the second luminescent material from environmental influences, for example, when the second luminescent material is applied to an outer wall of a phosphor-enhanced light source or of a light emitting diode device. Alternatively, the protective layer may, for example, protect the second luminescent material from scratches which preferably have to be prevented as scratches would generate an un-even appearance of the phosphor-enhanced light source, in operation.

In an embodiment of the luminescent converter, the luminescent converter comprises a mixture of luminescent materials, the mixture of luminescent materials comprising both the first luminescent material and the second luminescent material. A benefit of this embodiment is that the first luminescent material and the second luminescent material may be applied to the phosphor-enhanced light source in a single production step. Furthermore, the first luminescent material being inorganic luminescent material may function as scattering material in the mixture of luminescent materials. Often, luminescent material is applied in a layer of material. In such a layer light is often captured, for example, via internal reflection. Part of this captured light is often re-absorbed and thus lost which reduces the conversion efficiency of the luminescent converter. To prevent the light to be captured inside a layer, additional scattering material may be added to the luminescent layer. However, also scattering material represents some kind of light loss which is not preferred. By mixing the inorganic luminescent material being the first luminescent material with the organic luminescent material being the second luminescent material in a single mix of luminescent materials, the inorganic luminescent material may act as scattering material improving the extraction of light generated inside the luminescent material. A further benefit when using a mixture of luminescent materials is that the appearance of the phosphor-enhanced light source is determined by the mixture of the luminescent materials rather than the appearance of the upper luminescent material as would be the case in a stacked configuration. This would generate a more natural appearance of the phosphor-enhanced light source which would reduce consumer confusion.

In an embodiment of the luminescent converter, the luminescent converter is located at a distance from the light emitter constituting a remote phosphor arrangement. The remote phosphor arrangement provides a positioning of the luminescent material with respect to the light emitter such that high temperatures of the light emitter or high light-flux densities through the luminescent materials are prevented to ensure that the conversion efficiency and the life-time of the luminescent material is maintained and/or improved. Furthermore, the benefit when using a remote phosphor arrangement is that typically the range of luminescent materials to choose from is increased as many known luminescent materials cannot withstand harsh environments such as inner environments of discharge vessels of discharge lamps and high temperature environments when the luminescent material is applied directly on a solid-state light emitter. Especially organic luminescent materials are sensitive to relatively high light-flux densities and relatively high temperatures. Using the remote phosphor arrangement thus enables the use of a broad range of organic luminescent materials as second luminescent material.

In an embodiment of the luminescent converter, the second luminescent material is selected from a group comprising:

perylene derivatives such as lumogen F materials (e.g. 083 (yellow), 170 (yellow), 240 (orange), 305 (red), 850 (green), difluoro-boraindacene derivatives (BODIPY), Fluorescein dyes, fluerene derivatives, coumarin dyes, xanthene dyes, pyrromethene-BF2 (P-BF2) complexes, Stilbene derivatives, Rodamine dyes, perylene carboximide dyes, and luminescent polymers such as polyphenylenevinilene (PPV), polyphenyl derivatives.

The first luminescent material, for example, may comprise the following inorganic luminescent materials and/or mixtures thereof which absorb ultraviolet light or blue light:

$Lu_{1-x-y-a-b}Y_xGd_y)_3(Al_{1-z-u}Ga_zSi_u)_5O_{12-u}N_u:Ce_aPr_b$ wherein $0 \le x \le 1$, $0 \le y \le 1$, $0 < z \le 0.1$, $0 \le u \le 0.2$, $0 < a \le 0.2$ and $0 < b \le 0.1$, such as $Lu_3Al_5O_{12}:Ce^{3+}$ and $Y_3Al_5O_{12}:Ce^{3+}$, $(Sr_{1-a-b-c}Ca_bBa_c)Si_xN_yO_z:Eu_a^{2+}$ wherein a=0.002-0.2, b=0.0-0.25, c=0.0-1.0, x=1.5-2.5, y=0.67-2.5, z=1.5-4 including, for example, $SrSi_2N_2O_2:Eu^{2+}$ and $BaSi_2N_{0.67}O_4:Eu^{2+}$, $(Sr_{1-u-v-x}Mg_uCa_vBa_x)(Ga_{2-y-z}Al_yIn_z S_4):Eu^{2+}$ including, for example, $SrGa_2S_4:Eu^{2+}$, $(Sr_{1-x}Ba_x)_2SiO_4:Eu$, wherein $0 < x \le 1$, including, for example, $BaSrSiO_4:Eu^{2+}$, $(Ca_{1-x-y-a-b}Y_xLu_y)_3(SC_{1-z}Al_z)_2(Si_{1-x-y}Al_{x+y})_3O_{12}:Ce_aPr_b$ wherein $0 \le x \le 1$, $0 \le y \le 1$, $0 < z \le 1$, $0 \le u \le 0.2$, $0 < a \le 0.2$ and $0 < b \le 0.1$, such as $Ca_3Sc_2Si_3O_{12}:Ce^{3+}$.

According to a second aspect of the invention the object is achieved with a phosphor-enhanced light source comprising a light emitter emitting excitation light and comprising the luminescent converter according to the invention.

In an embodiment of the phosphor-enhanced light source, the light emitter comprises a solid-state light emitter. As mentioned before, solid-state light emitters is, for example, a light emitting diode, or a laser diode, or an organic light emitting diode. A benefit of this embodiment is that the use of solid-state light emitters enables the phosphor-enhanced light source to become very compact while having high light output. Furthermore, a broad range of solid-state light emitters emit light of the color Blue which light can directly contribute and can directly be mixed with the output light of the phosphor-enhanced light source to generate the output light having the predetermined color. As such, an additional light conversion from UV to visible can be omitted thus improving the efficiency of the phosphor-enhanced light source.

In an embodiment of the phosphor-enhanced light source, the light emitter comprises a discharge in a discharge lamp. A benefit of this embodiment compared to known discharge lamps is that the color rendering is improved (especially in the red) with additional benefits of a low penalty in losing efficacy compared to standard available high color rendering lamps (e.g. color 90 lamps). Furthermore, combining various mixtures of phosphor on the outside of discharge lamp enable an easy method to choose color temperature and color rendering after lamp-making In an embodiment of the phosphor-enhanced light source, the light emitter is configured for emitting excitation light comprising the primary color Blue. Even for discharge lamps a new type of discharge is developed, known as molecular discharge lamp, in which at least part of the light emitted by the discharge lamp is in the visible range, typically emitting Blue light. The benefit when using Blue light is the visible part of the excitation light which is not used for the excitation of the first luminescent material may directly contribute to the visible light emitted by the phosphor-enhanced light source without having to be converted via the first luminescent material or a second luminescent material into light of a longer wavelength. Omitting the need for converting part of the excitation wavelength further enhances the efficiency of the phosphor-enhanced light source. The excitation light may, for example, be visible light of the color Blue which may be used together with first luminescent material emitting light of the color green and the second luminescent material emitting light of the color red to obtain, at the right mixture, white light having a predefined color temperature.

In an embodiment of the phosphor-enhanced light source, the light emitter comprises the discharge of the discharge lamp, the discharge lamp comprising a discharge vessel enclosing, in a gastight manner, a discharge space comprising a gas filling and comprising discharge means for maintaining a discharge in the discharge space, in operation, for emitting the excitation light, wherein the second luminescent material is applied at a side of a wall of the discharge vessel facing away from the discharge. Generally the inside of the discharge vessel of a discharge lamp comprises a relatively harsh environment due to the presence of the gas-filling and due to the presence of the discharge near the wall of the discharge vessel. Still, when luminescent material is applied together with a discharge lamp, the luminescent materials have up to now typically be applied on a side of the wall of the discharge vessel facing the inside of the discharge vessel. The reason for this arrangement is that the discharge produces ultraviolet light which is converted by the luminescent materials into visible light. To allow ultraviolet light to pass the discharge vessel, the discharge vessel has to be produced of quartz or another UV-transparent material—making the discharge vessel very expensive. By having the conversion from ultraviolet light into visible light inside the discharge vessel, the wall of the discharge vessel only needs to be transparent to visible light, which reduces the cost of the discharge vessel considerably. Because of this, the known discharge lamps having a mixture of luminescent materials have the luminescent material applied to the wall of the discharge vessel facing the discharge. Using the organic luminescent material to improve the efficiency of the Red-contribution is not feasible in the known light sources, as the organic luminescent materials cannot today withstand the harsh environment inside the discharge vessel. As such, the known application of the organic luminescent materials is in literature typically limited to solid-state light sources. However, in the luminescent converter according to the invention, the second luminescent material comprising the organic luminescent material is excited using the first emission light, which typically is visible light. As such, using the second luminescent material in the arrangement according to the invention, the second luminescent material may very easily be applied outside the discharge vessel and as such may not need to be exposed to the harsh environment of the discharge vessel. So by applying the second luminescent material to the side of the wall of the discharge vessel facing away from the discharge, or said different, by applying the second luminescent material to the outside of the discharge vessel, the first emission light which is generated inside the discharge vessel is transmitted through the discharge vessel and subsequently impinges on the second luminescent material which absorbs part of this first emission light to generate the second emission light. As this can be done very efficiently, the applying of the organic luminescent material at the outside of the discharge vessel results in an efficient Red-contribution. The Blue- and Green-contribution is generated using the known luminescent materials arranged inside the discharge vessel. The standard luminescent material providing the Red-contribution (typically for example, YOX) is removed (or partly removed) and replaced by a second luminescent material comprising the organic luminescent material arranged on the outside of the discharge vessel, absorbing either a part of the Green light emitted by the discharge vessel or part of the Blue light emitted from the discharge vessel.

In an embodiment of the phosphor-enhanced light source, the light emitter comprises the discharge lamp, the discharge lamp comprising a discharge vessel enclosing, in a gastight manner, a discharge space comprising a gas filling and comprising discharge means for maintaining a discharge in the discharge space, in operation, for emitting the excitation light, the discharge lamp further comprising an outer bulb surrounding the discharge vessel, wherein the second luminescent material is arranged on a wall of the outer bulb. The outer bulb would increase the distance between the second luminescent material and the discharge vessel and thus would cause the second luminescent material to operate at further decreased temperatures. Furthermore, the applying of the second luminescent material on the inside of the outer bulb would protect the second luminescent material against scratches and would further enable to have a specific environment in which the second luminescent material is located. For example, the space between the discharge vessel and the outer bulb may be oxygen-free to prevent oxidation of the luminescent material arranged in the outer bulb. Still, the Blue and Green light emitting phosphor may be applied inside discharge vessel as these well known phosphors can withstand the hash environment, have good efficiency and prevent the discharge vessel in the phosphor-enhanced light source to be manufactured from UV-transparent material.

In an embodiment of the phosphor-enhanced light source, the second luminescent material is arranged on a side of the wall of the outer bulb facing the discharge vessel. A benefit of this arrangement is that the temperature of the second luminescent material is further reduced.

BRIEF DESCRIPTION OF THE DRAWINGS

These and other aspects of the invention are apparent from and will be elucidated with reference to the embodiments described hereinafter.

In the drawings.

The figures are purely diagrammatic and not drawn to scale. Particularly for clarity, some dimensions are exaggerated strongly. Similar components in the figures are denoted by the same reference numerals as much as possible.

DETAILED DESCRIPTION OF EMBODIMENTS

Figure 1A:
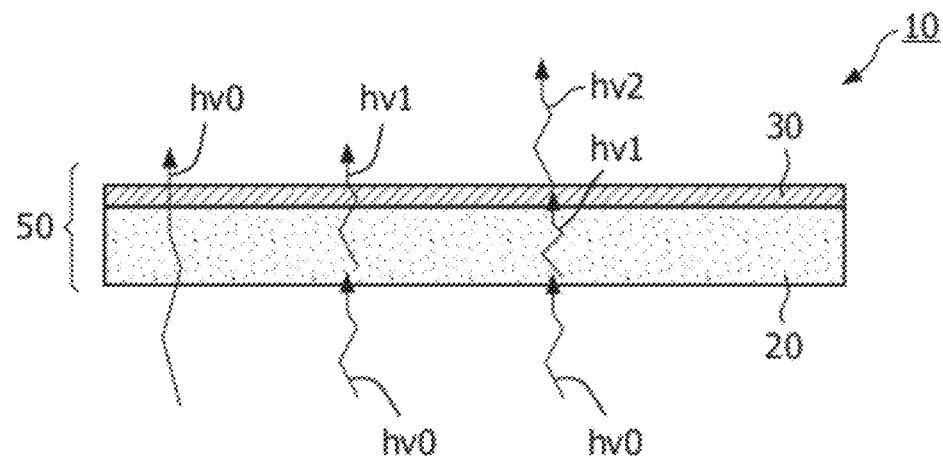
FIGS. 1A and 1B show a luminescent converter according to the invention.
Figure 1B:
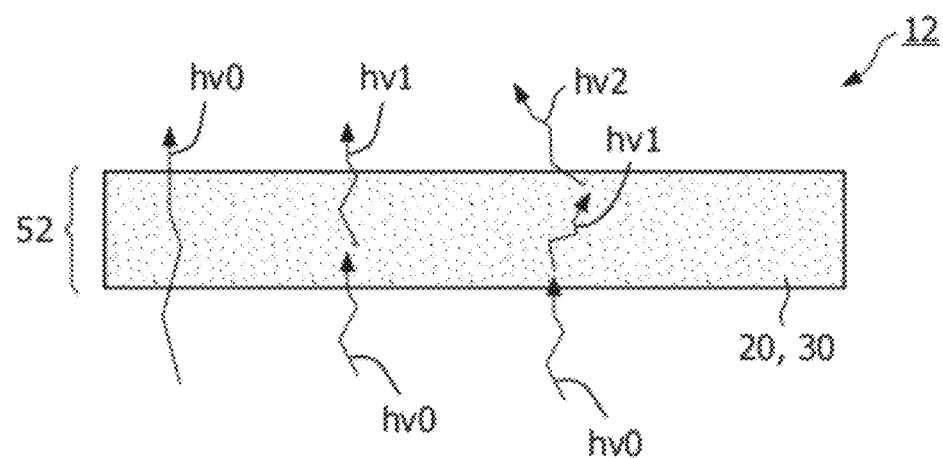

FIGS. 1A and 1B show a luminescent converter 10, 12 according to the invention. The luminescent converted 10, 12 is constituted of two different luminescent materials, a first luminescent material 20 and a second luminescent material 30 comprising an organic luminescent material 30. The first luminescent material 20 is configured for absorbing at least a part excitation light hv0 which impinges on the luminescent converter 10, 12. A part of the light absorbed by the first luminescent material 20 is subsequently converted into first emission light hv1 having a longer wavelength and emitted by the first luminescent material 20. The non-absorbed part of the excitation light hv0 may, for example, be transmitted through the luminescent converter 10, 12 and may contribute to the overall light emitted by the luminescent converter 10, 12 via mixing with the light emitted by the first luminescent material 20 and the second luminescent material 30. The second luminescent material 30 is configured for absorbing at least a part of the first emission light hv1 and converts a part of the absorbed first emission light hv1 into second emission light hv2 which has a longer wavelength compared to the first emission length hv1. As such, the first emission light hv1 is used to excite the second luminescent material 30 being the organic luminescent material 30.

In the text above, a part of impinging light is absorbed by luminescent material which subsequently converts a further part of the absorbed light into light of a longer wavelength. The part of the impinging light which is absorbed and the subsequent further part which is converted into light of a longer wavelength typically are different. How much of the impinging light is absorbed depends, for example, on the concentration of the specific luminescent material which is illuminated with the excitation light. How much of the absorbed light is subsequently converted depends typically on the quantum efficiency of the luminescent material and thus varies for each luminescent material. As such, by varying the concentration of the luminescent material the contribution of the excitation light hv0, first emission light hv1 and second emission light hv2 to the overall light emitted by the luminescent converter 10, 12 can be determined which determines the overall color of light emitted by the luminescent converter 10, 12.

The inventors have found that the two-step light conversion according to the invention generates a relatively small Stokes shift of the light emitted by the organic luminescent material 30. From experiments it is found that this relatively small Stokes shift results in an emission spectrum hv2 emitted by the organic luminescent material 30 which remains relatively narrow. Typically the second emission light hv2 has relatively long wavelength and typically represents the "Red"-contribution to light emitted by a phosphor enhanced light source 100, 102, 104 (see FIGS. 2 and 3). This "Red"-contribution should preferably have an emission spectrum hv2 having a specific width rather than a substantial line emission to ensure good color rendering characteristics of the phosphor-enhanced light source 100, 102, 104. However, typically the "Red"-contribution should not comprise too much infrared light as this only results in emission of non-usable infrared light which again reduces the efficiency of the phosphor enhanced light source 100, 102, 104. By reducing the Stokes shift of the organic luminescent material 30, the width of the spectrum of the second emission light 30 is limited such that a sufficient "Red"-contribution may be obtained to have good color rendering while substantially no light is emitted in the infrared part of the spectrum. As such, the efficiency is improved.

FIG. 1A shows an embodiment in which the luminescent converter 10 comprises a stack 50 of the first luminescent material 20 and the second luminescent material 30 arranged in separate layers of luminescent material. As such, the stack 50 of layers of luminescent materials 20, 30 enables that each of the different luminescent materials may be applied to a carrier material (not shown) via a production process which is best suited for the specific luminescent material 20, 30. Generally when both organic and inorganic luminescent materials are mixed to generate the luminescent converter 10, 12 these different materials not necessarily mix in, for example, the same solvent. Alternatively, the heat resistance of the different luminescent materials 20, 30 may be too different to simply mix them. Thus the stack 50 of layers enables to apply the individual luminescent materials 20, 30 using their own optimized processes.

FIG. 1B shows an embodiment in which the luminescent converter 12 is constituted of a mixture of luminescent materials 52 further also indicated as a matrix 52. The matrix 52 as shown in FIG. 1B comprises a mixture of the first luminescent material 20 and the second luminescent material 30. In such an arrangement, the mixture of multiple luminescent materials may be applied simultaneously, reducing the process steps needed to produce the luminescent converter 12. Furthermore, the use of the matrix 52 enables to use some inorganic luminescent materials, for example, the first luminescent material 20 as scattering material to improve the out-coupling and absorption of light from the matrix 52. Generally, light may be captured in a transparent layer of material such as the matrix 52. This capturing is typically based on total internal reflection and relatively efficient such that this is often used in light guides. However, when capturing light in the matrix 52, part of this captured light is lost due to absorption losses inside the matrix 52, which substantially reduce the efficiency of the luminescent converter 10, 12. Adding additional scattering bodies or light extraction structures may of course also be used, but also such additional scattering bodies represent some loss in the system and reduce the overall efficiency. By mixing, for example, crystals of inorganic luminescent material inside the matrix 52, for example, the first luminescent material 20, the extraction of light can be improved without having to add additional material to the matrix 52.

The luminescent converter 10, 12 as shown in FIGS. 1A and 1B may be applied directly on the light emitter 40, 42 (see FIGS. 2 and 3) or may be applied at a distance from the light emitter 40, 42 such that a remote phosphor arrangement is generated. This remote phosphor arrangement is well known and provides the benefits that the temperature of the luminescent materials, in operation, remains lower compared to when the luminescent materials are directly applied on the light emitter 40, 42. A further benefit of this remote phosphor arrangement is that the light flux through the remote phosphor is typically smaller due to the distance. High temperature and light flux through the luminescent material may cause the luminescent material to degrade faster. As such, by using a remote phosphor arrangement, a broader range of luminescent materials may be applied in the luminescent converter 10, 12 for the phosphor-enhanced light source 100, 102, 104.

Figure 2A:
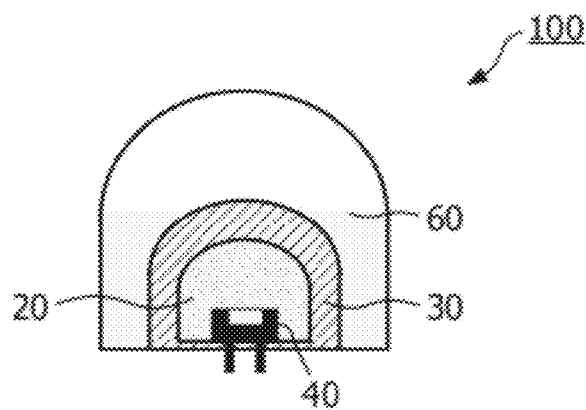
FIGS. 2A and 2B show an embodiment of a phosphor-enhanced light source comprising a solid-state light emitter and a luminescent converter according to the invention.
Figure 2B:
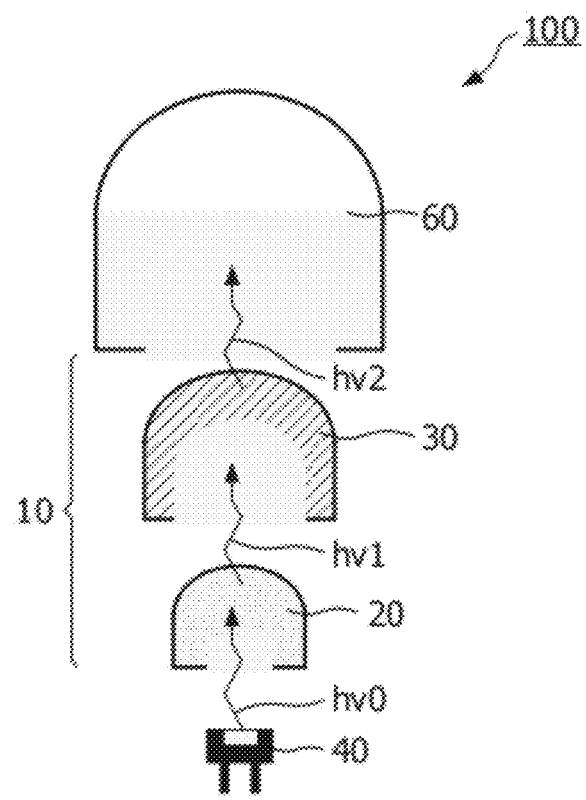

FIGS. 2A and 2B show an embodiment of a phosphor-enhanced light source 100 comprising a solid-state light emitter 40 and a luminescent converter 10 according to the invention. FIG. 2A show an assembled phosphor-enhanced light source 100 and FIG. 2B shows the individual elements 20, 30, 40, 60 of the phosphor-enhanced light source 100. On the solid-state light emitter 40 a first luminescent material 20 is configured for converting at least a part of the excitation light hv0 emitted by the solid-state light emitter 40 into first emission light hv1. Subsequently, on top of the first luminescent material 20 a second luminescent material 30 is arranged which is configured for converting at least a part of the first emission light hv1 into second emission light hv2. Because not all of the excitation light hv0 and not all of the first emission light hv1 is converted, the emission of the phosphor-enhanced light source 100 typically comprises a mixture of the excitation light hv0, the first emission light hv1 and the second emission light hv2. In addition, a light shaping element 60 may be applied on top of the second luminescent material 30 to shape the light emitted by the phosphor-enhanced light source 100.

Preferably, the excitation light hv0 is Blue light as this would contribute to the Blue-contribution to generate White light emitted from the phosphor-enhanced light source 100. Alternatively, the solid-state light emitter 40 may emit ultraviolet light hv0 which must be converted, for example, in Blue light and Yellow light to generate White light. In such a configuration, the light shaping element 60 may be constituted of UV-blocking material or may comprise a UV-blocking layer (not shown) to prevent ultraviolet light to be emitted from the phosphor-enhanced light source 100. In case the excitation light hv0 is ultraviolet light, the luminescent converter 10, 12 may comprise an additional luminescent material such that three different colors of light are generated from the impinging ultraviolet light hv0. The additional luminescent material may, for example, convert ultraviolet light into Blue light, the first luminescent material 20 may, for example, convert ultraviolet light into Green light, and the second luminescent material 30 may, for example, convert part of the Green light into Red light.

In the arrangement shown in FIGS. 2A and 2B the luminescent converter 10 is substantially directly attached to the solid-state light emitter 40. This does not represent a remote phosphor arrangement as in the arrangement shown in FIGS. 2A and 2B the first luminescent material 20 and the second luminescent material 30 will become relatively hot, in operation, and will experience a relatively high light flux, in operation, which clearly limits the choice of luminescent materials suitable for this arrangement. Alternatively, of course, the luminescent converter 10 may be arranged as a self-supporting element which is, for example, placed at a distance (not shown) from the solid-state light emitter 40 in a remote phosphor arrangement. For example, the solid-state light emitter 40 may be arranged in a reflector cup (not shown) which comprises somewhere in the reflector cup at a distance from the solid-state light emitter 40 the luminescent converter 10, 12 according to any of the FIG. 1A or 1B. Alternatively, the luminescent converter 10, 12 may be arranged at or may be part of a collimator (not shown) which collimates the light of the solid-state light emitter 40.

Furthermore, in the arrangement shown in FIGS. 2A and 2B the luminescent converter 10 comprises a stack 50 (see FIG. 1A) of different luminescent materials 20, 30. This stack 50 of different luminescent materials may of course be exchanged by a matrix 52 comprising a mixture of different luminescent materials as indicated in FIG. 1B.

Figure 3A:
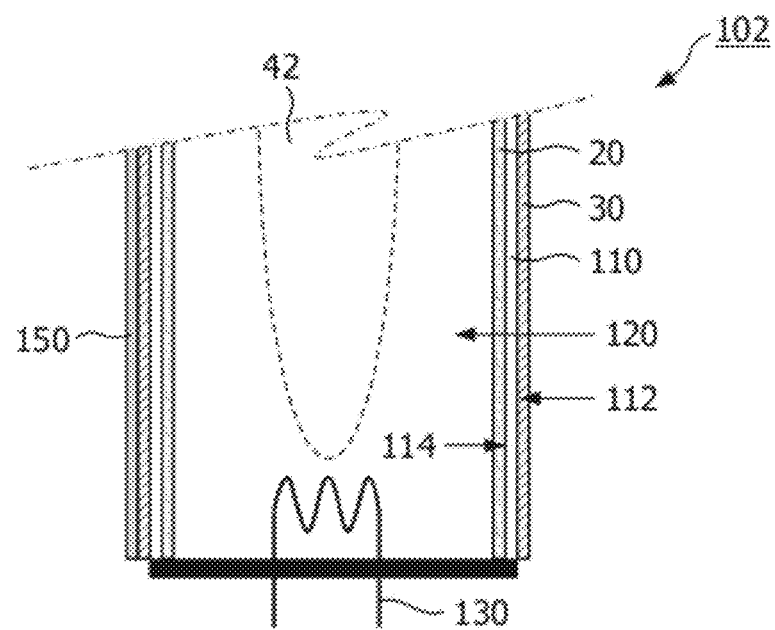
FIGS. 3A and 3B shows an embodiment of a phosphor-enhanced light sources constituting a discharge lamp in which the light emitter is constituted of the discharge of the discharge lamp.
Figure 3B:
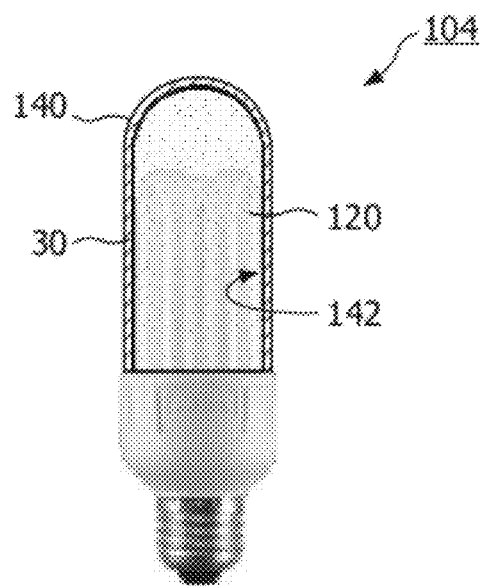

FIGS. 3A and 3B shows an embodiment of phosphor-enhanced light sources 102, 104 constituting a discharge lamp 102, 104 in which the light emitter 42 is constituted of the discharge 42 of the discharge lamp 102, 104. The phosphor-enhanced light sources 102, 104 further comprise a luminescent converter 10, 12 according to the invention. The discharge lamp 102, 104 comprises a discharge vessel 110 which encloses a discharge space 120 in a gastight manner. The discharge vessel 110 comprises a gas filling and comprises discharge means 130 for maintaining, in operation, a discharge 42 in the discharge space 120. The excitation light hv0 emitted, in operation, from the discharge 42 depends, for example, on the gas filling in the discharge vessel 110. In the embodiment shown in FIG. 3A the first luminescent material 20 is applied inside the discharge vessel on a wall 114 of the discharge vessel 110 facing the discharge 42. A benefit of this arrangement is that when the excitation light hv0 is ultraviolet light hv0, the first luminescent material 20 converts this ultraviolet light hv0 into first emission light hv1 which preferably is visible light hv1 and which relatively easily travels through the discharge vessel 110. The second luminescent material 30 is applied to the outside of the discharge vessel 110, so is applied to the wall 112 of the discharge vessel 110 facing away from the discharge 42. As such, the second luminescent material 30 is not exposed to the harsh environment inside the discharge vessel 110 and is exposed to lower temperatures compared to the first luminescent material 20. Still, due to fact that the second luminescent material 30 is configured to absorb part of the first emission light hv1, which in the current case is visible light hv1, no ultraviolet light hv0 has to be emitted from the discharge vessel 110 and as such, the discharge vessel 110 does not need to be produced from quartz or otherwise UV-transparent material which limits the cost of the discharge vessel 110. As the luminescent material providing the "Red"-contribution in known discharge lamps with a high CRI has a relatively poor efficiency, while the "Blue"-contributing luminescent materials and the "Green"-contributing materials have good efficiency, the use of the second luminescent material 30 being an organic luminescent material 30 having high quantum efficiency outside the discharge vessel considerably increases the efficiency of the high-CRI discharge lamp 102, 104.

In the embodiment shown in FIG. 3A only part of the discharge lamp 102 is shown and only one of at least two discharge means 130 being an electrode 130 is shown. In addition, left part of the embodiment shown in FIG. 3A comprises an additional layer 150 applied on top of the second luminescent layer 30 and is a protective layer 150 for protecting the second luminescent material 30. Such a protective layer 150 may, for example, protect the second luminescent material 30 from environmental influences outside the phosphor-enhanced light source 102, or may, for example, protect the second luminescent material 30 from being scratched. It should be clear that if such protective layer 150 is required, the protective layer 150 is applied to cover all of the second luminescent material 30, so also on the right-hand side of the embodiment shown in FIG. 3A.

Alternatively, the luminescent material 30 in FIGS. 3A and 3B can also be a mixture 30 of the first and second luminescent material and in which a third luminescent material 20 is arranged on the inner wall 114 of the discharge vessel 110. This third luminescent material 20 may, for example, emit light of which part is absorbed by the first luminescent material and converted into light having a longer wavelength. Subsequently, part of the light emitted by the first luminescent material is absorbed by the second luminescent material comprised in the mixture 30 and converted into light having an even longer wavelength. Such a three-step conversion is, for example, shown in FIG. 5B In the embodiment shown in FIG. 3B the phosphor-enhanced light source 104 further comprises an outer bulb 140 surrounding the discharge vessel 110. The second luminescent material 30 is arranged on a wall of the outer bulb 140. In the arrangement shown in FIG. 3B the distance between the second luminescent material 30 and the discharge vessel 110 is further increased, typically further reducing the temperature of the second luminescent material 30. The second luminescent material 30 may, for example, be applied on the inside of the outer bulb 140, so on a side 142 of the wall of the outer bulb 140 facing the discharge vessel 110. In this arrangement, as shown in FIG. 3B, the outer bulb 140 may be used to create a special environment for the second luminescent material 30, for example, generate an oxygen-free environment to prevent oxidation of the second luminescent material 30. Alternatively, the room between the outer bulb 140 and the discharge vessel 110 may be a vacuum to prevent conduction of heat from the discharge vessel 110 towards the second luminescent material 30.

Alternatively, the second luminescent material 30 may be applied to the outside of the outer bulb 140 (not shown) so to a wall of the outer bulb 140 facing away from the discharge vessel 110. In such an arrangement, the protective layer 150 (see FIG. 3A) may again be applied on top of the second luminescent material 30 to protect the second luminescent material 30.

A further benefit when using the outer bulb 140 is that it may be relatively easy to change the color of the phosphor-enhanced light source 104, simply by exchanging the outer bulb 140 by an outer bulb 140 having a different luminescent material or having a different mixture of luminescent materials.

Figure 4A:
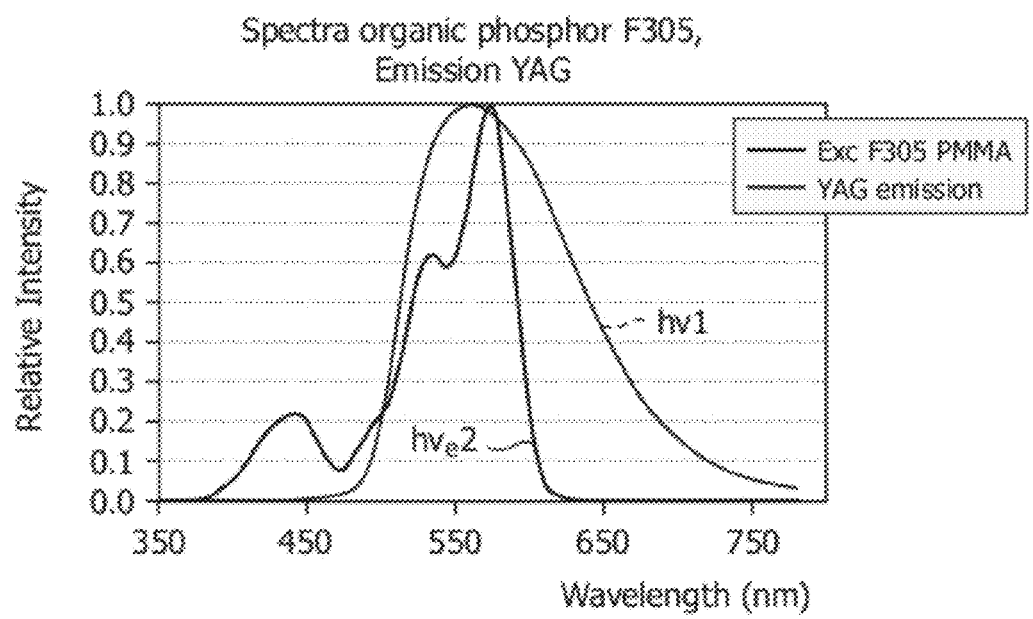
FIG. 4A shows an excitation spectrum of an organic luminescent material and the emission spectrum of an inorganic luminescent material YAG emitting Green light.

FIG. 4A shows an excitation spectrum $hv_e2$ of the second luminescent material 30 being an organic luminescent material 30 known as F305, and the first emission spectrum hv1 of the first luminescent material 20 being an inorganic luminescent material known as YAG emitting Green light. As can clearly be seen from the FIG. 4A the peak absorption of the second luminescent material 30 substantially coincides with the emission peak of the first emission light hv1. As such, it is clear that using the organic luminescent material 30 known as F305 enables to efficiently absorb part of the first emission light hv1 and to convert part of the absorbed first emission light hv1 into second emission light hv2.

Figure 4B:
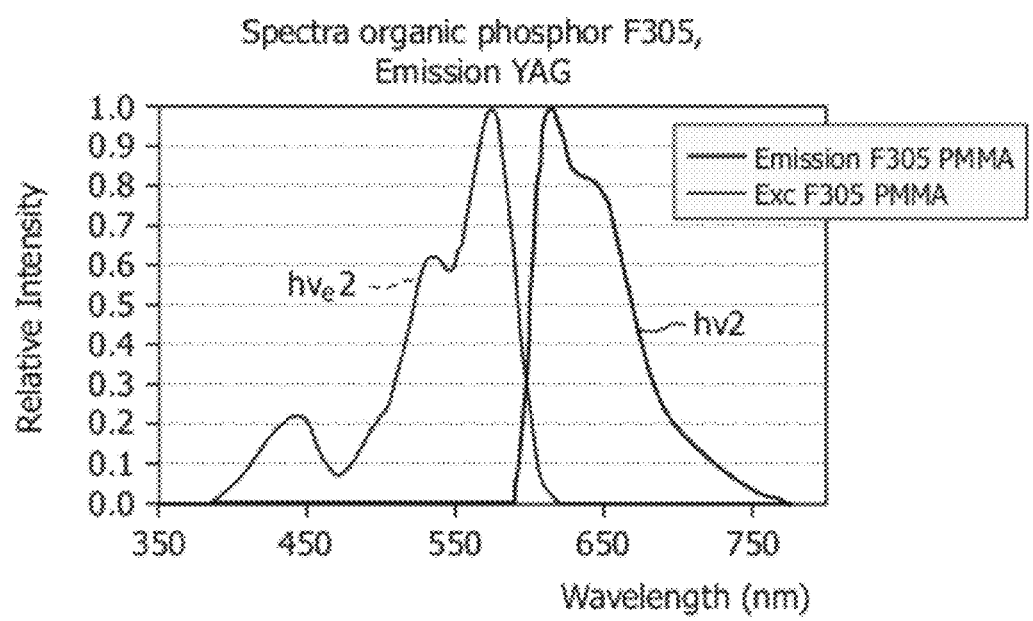
FIG. 4B shows the excitation and emission spectrum of the organic luminescent material.

FIG. 4B shows both the excitation spectrum $hv_e2$ and the spectrum of the second emission light hv2 of the second luminescent material 30 being the organic luminescent material 30 known as F305. From the shown spectra it is clear that the Stokes-shift during the light conversion of the organic luminescent material 30 known as F305 is typically less than 100 nanometers. Furthermore, one can directly observe that the spectrum of the second emission light hv2 is not too broad which results in good color rendering due to the "Red"-contribution of the organic luminescent material 30 while substantially no light is emitted in the infrared.

Figure 5A:
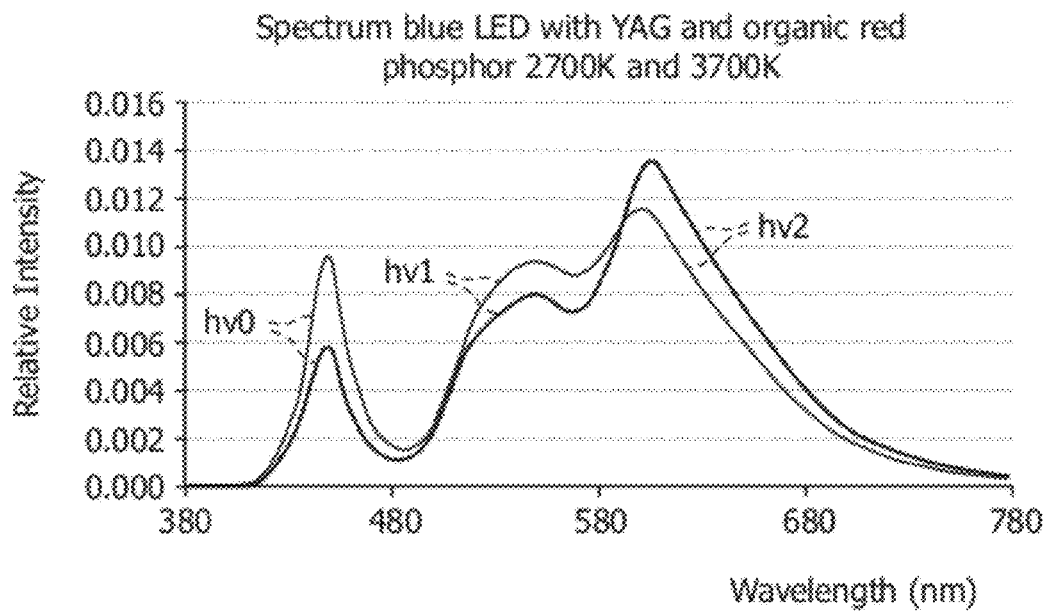
FIG. 5A shows the emission spectrum of a phosphor-enhanced light source comprising a Blue excitation light from a solid-state light emitter, Green first emission light from the first luminescent material and Red second emission light from the organic luminescent material.

FIG. 5A shows the emission spectrum of a phosphor-enhanced light source 100 (see FIG. 2) comprising a Blue excitation light from a solid-state light emitter 40 (see FIG. 2), Green first emission light hv1 from the first luminescent material 20 and Red second emission light hv2 from the organic luminescent material 30. As first luminescent material 20 again the luminescent material known as YAG is used which absorbs the excitation light hv0 and converts part of the excitation light hv0 into first emission light hv1 being Green light. Subsequently, part of the first emission light hv1 is absorbed by the second luminescent material 30 and converted to second emission light hv2. The difference between the two spectra shown in FIG. 5A is caused by different concentrations of first luminescent material 20 and second luminescent material 30 in the luminescent converter 10, 12. Furthermore, it is clear that the excitation light hv0 emitted by the solid-state light emitter 40 typically has a relatively narrow spectrum, while the first emission light hv1 and the second emission light hv2 have broader spectra which partly overlap. This relatively broad spectrum generally enables good color rendering by the phosphor-enhanced light source 100.

Figure 5B:
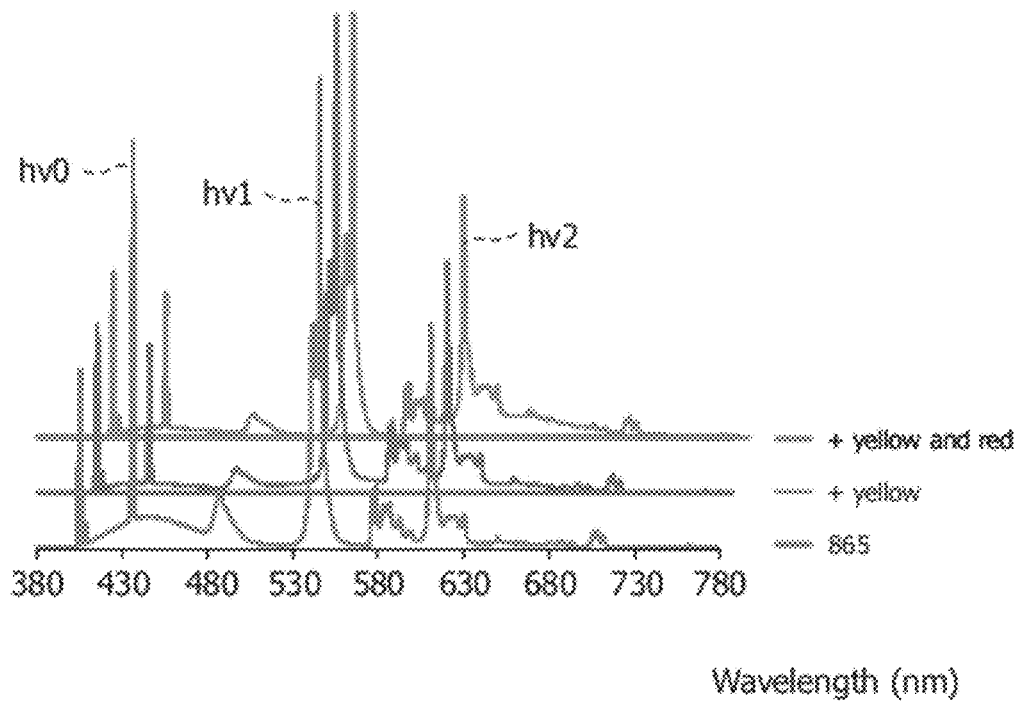
FIG. 5B shows the emission spectrum of a discharge lamp comprising the inorganic first luminescent material YAG and the organic second luminescent material.

FIG. 5B shows the emission spectrum of a discharge lamp 102, 104 comprising the inorganic luminescent material YAG and the organic luminescent material. An additional phosphor mixture (indicated with text 865) inside the discharge vessel 110 converts the ultraviolet radiation from the discharge vessel into Blue light hv0 emitted from the discharge vessel 110 (see FIG. 3A or 3B). A part of the Blue light hv0 emitted by the additional phosphor is subsequently absorbed by the first luminescent material 30 being YAG:Ce. The YAG:Ce subsequently converts part of the absorbed Blue light hv0 into Green light hv1 and emits the Green light hv1. From this Green light hv1 a part is being absorbed again by the Lumogen F 305 to generate the additional Red light hv2 emission. So actually this is a 3-step light conversion.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A luminescent converter for a phosphor-enhanced light source, the luminescent converter comprising:
   a first luminescent material configured for absorbing at least a part of excitation light emitted by a light emitter of the phosphor-enhanced light source, and for converting at least a part of the absorbed excitation light into first emission light comprising a longer wavelength compared to the excitation light, and
   a second luminescent material comprising organic luminescent material that is configured for absorbing at least a part of the first emission light emitted by the first luminescent material, and for converting at least a part of the absorbed first emission light into second emission light having a longer wavelength compared to the first emission light, wherein the wavelength difference between the first emission light and the second emission light is less than 100 nanometers, wherein the first luminescent material and the second luminescent material constitute layers of luminescent material in a stack of luminescent materials.

2. Luminescent converter as claimed in claim 1, wherein the first luminescent material comprises an inorganic luminescent material.

3. Luminescent converter as claimed in claim 1, wherein a protective layer is applied on the second luminescent material for protecting the second luminescent material.

4. Luminescent converter as claimed in claim 1, wherein the luminescent converter comprises a mixture of luminescent materials, the mixture of luminescent materials comprising both the first luminescent material and the second luminescent material.

5. Luminescent converter as claimed in claim 1, wherein the luminescent converter is located at a distance from the light emitter constituting a remote phosphor arrangement.

6. Luminescent converter as claimed in claim 1, wherein the second luminescent material comprises:
   perylene derivatives comprising Lumogen F materials comprising 083 emitting Yellow light, 170 emitting Yellow light, 240 emitting Orange light, 305 emitting Red light, 850 emitting Green light, difluoro-boraindacene derivatives, Fluorescein dyes, fluerene derivatives, coumarin dyes, xanthene dyes, pyrromethene-BF2 complexes, Stilbene derivatives, Rodamine dyes, perylene carboximide dyes, or luminescent polymers comprising polyphenylenevinilene or polyphenyl derivatives.

7. Phosphor-enhanced light source comprising a light emitter emitting excitation light and comprising the luminescent converter according to claim 1.

8. Phosphor-enhanced light source as claimed in claim 7, wherein the light emitter comprises a solid-state light emitter.

9. Phosphor-enhanced light source as claimed in claim 7, wherein the light emitter comprises a discharge in a discharge lamp.

10. Phosphor-enhanced light source as claimed in claim 6, wherein the light emitter is configured for emitting excitation light comprising the primary color Blue.

11. Phosphor-enhanced light source as claimed in claim 9, the discharge lamp comprising a discharge vessel enclosing, in a gastight manner, a discharge space comprising a gas filling and comprising discharge means for maintaining a discharge in the discharge space, in operation, for emitting the excitation light, wherein the second luminescent material is applied at a side of a wall of the discharge vessel facing away from the discharge.

12. Phosphor-enhanced light source as claimed in claim 9, the discharge lamp comprising a discharge vessel enclosing, in a gastight manner, a discharge space comprising a gas filling and comprising discharge means for maintaining a discharge in the discharge space, in operation, for emitting the excitation light, the discharge lamp further comprising an outer bulb surrounding the discharge vessel, wherein the second luminescent material is arranged on a wall of the outer bulb.

13. Phosphor-enhanced light source as claimed in claim 12, wherein the second luminescent material is arranged on a side of the wall of the outer bulb facing the discharge vessel.

14. A luminescent converter for a phosphor-enhanced light source, the luminescent converter comprising:
   a first luminescent material configured for absorbing at least a part of excitation light emitted by a light emitter of the phosphor-enhanced light source, and for converting at least a part of the absorbed excitation light into first emission light comprising a longer wavelength compared to the excitation light, and
   a second luminescent material comprising organic luminescent material that is configured for absorbing at least a part of the first emission light emitted by the first luminescent material, and for converting at least a part of the absorbed first emission light into second emission light having a longer wavelength compared to the first emission light, wherein the wavelength difference between the first emission light and the second emission light is less than 100 nanometers,
   wherein a Stokes shift of said organic luminescent material for said converting of the at least a part of the absorbed first emission light is less than 100 nm.

15. Luminescent converter as claimed in claim 14, wherein the second emission light is red light.

16. A luminescent converter for a phosphor-enhanced light source, the luminescent converter comprising a first luminescent material configured for absorbing at least a part of excitation light emitted by a light emitter of the phosphor-enhanced light source, and for converting at least a part of the absorbed excitation light into first emission light comprising a longer wavelength compared to the excitation light, and a second luminescent material comprising organic luminescent material that is configured for absorbing at least a part of the first emission light emitted by the first luminescent material, and for converting at least a part of the absorbed first emission light into second emission light having a longer wavelength compared to the first emission light, wherein the wavelength difference between the first emission light and the second emission light is less than 100 nanometers, wherein the second emission light is red light.

* * * * *